US007525454B2

(12) United States Patent
Jung et al.

(10) Patent No.: US 7,525,454 B2
(45) Date of Patent: Apr. 28, 2009

(54) KEYPAD ASSEMBLY FOR A PORTABLE TERMINAL

(75) Inventors: Sun-Tae Jung, Anyang-si (KR); Joo-Hoon Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 113 days.

(21) Appl. No.: 11/363,850

(22) Filed: Feb. 28, 2006

(65) Prior Publication Data

US 2006/0261984 A1 Nov. 23, 2006

(30) Foreign Application Priority Data

May 19, 2005 (KR) ...................... 10-2005-0042070

(51) Int. Cl.
*H03K 17/00* (2006.01)

(52) U.S. Cl. .......................................... 341/22; 341/31

(58) Field of Classification Search .................. 341/22, 341/176, 31, 13, 14; 345/168, 169; 379/368; 200/310, 313, 295, 278
See application file for complete search history.

(56) References Cited

U.S. PATENT DOCUMENTS

| | | | | |
|---|---|---|---|---|
| 5,128,842 | A | 7/1992 | Kenmochi | 362/95 |
| 5,491,313 | A | 2/1996 | Bartley et al. | 200/310 |
| 5,975,711 | A * | 11/1999 | Parker et al. | 362/24 |
| 7,186,935 | B2 * | 3/2007 | Lee et al. | 200/310 |
| 2002/0122683 | A1 | 9/2002 | Kamei et al. | |
| 2003/0095398 | A1 | 5/2003 | Parker et al. | |
| 2003/0103359 | A1 | 6/2003 | Chiang et al. | |
| 2004/0018796 | A1 | 1/2004 | Hamada | |

FOREIGN PATENT DOCUMENTS

| | | |
|---|---|---|
| DE | 8510863 | 5/1985 |
| EP | 0478105 A2 | 4/1992 |
| EP | 0751340 A2 | 1/1997 |
| JP | 62-77825 | 5/1987 |
| JP | 03-257728 | 11/1991 |
| JP | 2000-215747 | 8/2000 |
| JP | 2001-155586 | 6/2001 |
| JP | 2001-167655 | 6/2001 |
| JP | 2001-358816 | 12/2001 |
| JP | 2002-300258 | 10/2002 |
| JP | 2002-343176 | 11/2002 |
| JP | 2003-068161 | 3/2003 |
| JP | 2003-151392 | 5/2003 |
| JP | 2004-069751 | 3/2004 |
| JP | 2004-079232 | 3/2004 |
| JP | 2004-139983 | 5/2004 |
| JP | 2004-193891 | 7/2004 |
| JP | 2004-253384 | 9/2004 |

(Continued)

*Primary Examiner*—Albert K Wong
*Assistant Examiner*—Hung Q Dang
(74) *Attorney, Agent, or Firm*—Cha & Reiter, LLC

(57) ABSTRACT

A keypad assembly includes a keypad having at least one elastic layer and at least one key button on the elastic layer, a waveguide for transmitting and guiding light therethrough, the waveguide being placed below the elastic layer and having at least one reflection pattern to reflect light toward a respective key button, and a switch substrate under the waveguide and having at least one switch corresponding to the respective key button.

14 Claims, 7 Drawing Sheets

FOREIGN PATENT DOCUMENTS

| | | |
|---|---|---|
| JP | 2004-356028 | 12/2004 |
| KR | 2001-43054 | 5/2001 |
| SU | 1705817 | 1/1992 |
| TW | 525178 | 3/2003 |
| TW | 525198 | 3/2003 |
| TW | 2005-11094 | 3/2005 |

* cited by examiner

KEYPAD ASSEMBLY FOR A PORTABLE TERMINAL

CLAIM OF PRIORITY

This application claims priority to an application entitled "Keypad Assembly," filed with the Korean Intellectual Property Office on May 19, 2005 and assigned Serial No. 2005-42070, the contents of which are incorporated herein by reference.

BACKGROUND OF THE INVENTION

1. Field of the Invention

The present invention relates to a keypad assembly for use with a terminal, and more particularly to a keypad assembly for use with a terminal, which includes lighting elements.

2. Description of the Related Art

Generally, a keypad assembly of a conventional portable terminal, including without limitation portable, wireless communication terminals, comprises a keypad and a switch substrate. The keypad includes a plate-shaped elastic layer and a plurality of key buttons. The plurality of key buttons is formed on a first surface of the elastic layer. In the keypad, letter, numbers and characters, etc., are respectively printed on a surface of each key button. The switch substrate has a plurality of switches integrated therewith to provide electric contact as each key button is pushed. The switch substrate converts a depression of a respective key button into an electric signal.

The portable terminal has lighting elements enabling a user to use the keypad in the dark. A plurality of light emitting diodes and inorganic electro luminescence are used as the lighting elements. The light emitting diodes are generally arranged on a printed circuit board, while the inorganic electro luminescence is inserted in an elastic pad.

FIG. 1 is a sectional view of a conventional keypad assembly 100 including a plurality of light emitting diodes. Referring to FIG. 1, the conventional keypad assembly 100 includes a switch substrate 120, a plurality of diodes 122 and a keypad 110.

The keypad 110 includes a plate-shaped elastic layer 111, a plurality of key buttons 112, and a plurality of protrusions 111*a* formed on a second surface of the elastic layer 111 opposite to the first surface. Characters and the like are printed on a first surface of each key button 112. Each key button 112 and the corresponding protrusion 111*a* are aligned vertically.

The switch substrate 120 includes a plate type printed circuit board 120*a* and a plurality of switches 121. The plurality of switches 121 is formed on an upper surface of the printed circuit board 120*a* while being opposed to the keypad 110. Each switch 121 includes a conductive contact member and a conductive dome fully covering the contact member. The light emitting diodes 122 are mounted on the upper surface of the printed circuit board 120*a*.

In order to ensure operation of the switch 121, each light emitting diode 122 is preferably prevented from being located in vertical alignment with a corresponding key button 112. That is, the light emitting diodes 122 are respectively placed between the switches 121, so as to emit the light to the respective key buttons 112 at an oblique angle. This in turn causes the light to unevenly reach each key button 112. Therefore, the respective key buttons may be shaded in darkness.

In order to solve the above-mentioned problem, some conventional keypad assemblies have been proposed which includes a keypad having an elastic layer and inorganic electro luminescence inserted in the elastic layer. However, a separate AC electric source is necessary in order to use the inorganic electro luminescence. That is, such a keypad assembly requires an inverter for converting DC to AC. As a result, the volume and manufacturing cost of the keypad assembly increases. In addition, DC to AC conversion generates noise in the portable terminal.

SUMMARY OF THE INVENTION

Accordingly, the present invention has been made to reduce or overcome the above-mentioned problems occurring in the prior art and provides additional advantages, by providing a keypad assembly for a use with a terminal (e.g. a portable terminal), which includes a waveguide capable of illuminating keys with uniform brightness.

According to a first embodiment of the present invention, a keypad assembly includes a keypad having at least one elastic layer and at least one key button on the elastic layer, a waveguide for transmitting and guiding light therethrough, the waveguide being placed below the elastic layer and having at least one reflection pattern to reflect light toward a respective key button, and a switch substrate under the waveguide and having at least one switch corresponding to the respective key button.

BRIEF DESCRIPTION OF THE DRAWINGS

The present invention will be more apparent from the following detailed description taken in conjunction with the accompanying drawings, in which.

DETAILED DESCRIPTION

Hereinafter, the embodiments of the present invention will be described with reference to the accompanying drawings. For the purposes of clarity and simplicity, a detailed description of known functions and configurations incorporated herein is omitted to avoid making the subject matter of the present invention unclear.

Figure 1:
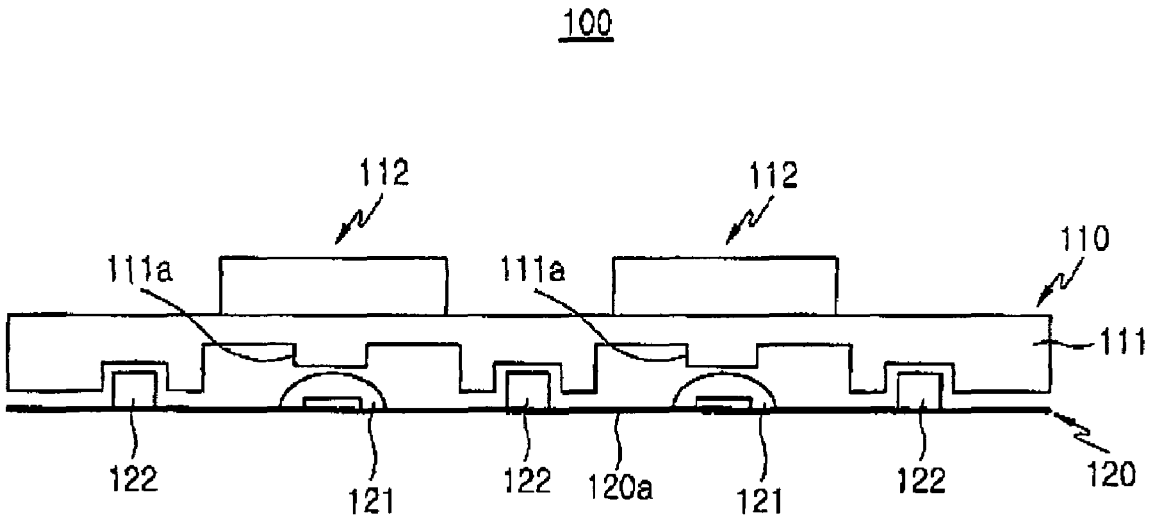
FIG.1 (PRIOR ART)
FIG. 1 is a sectional view of a conventional keypad assembly for a portable terminal.
Figure 2:
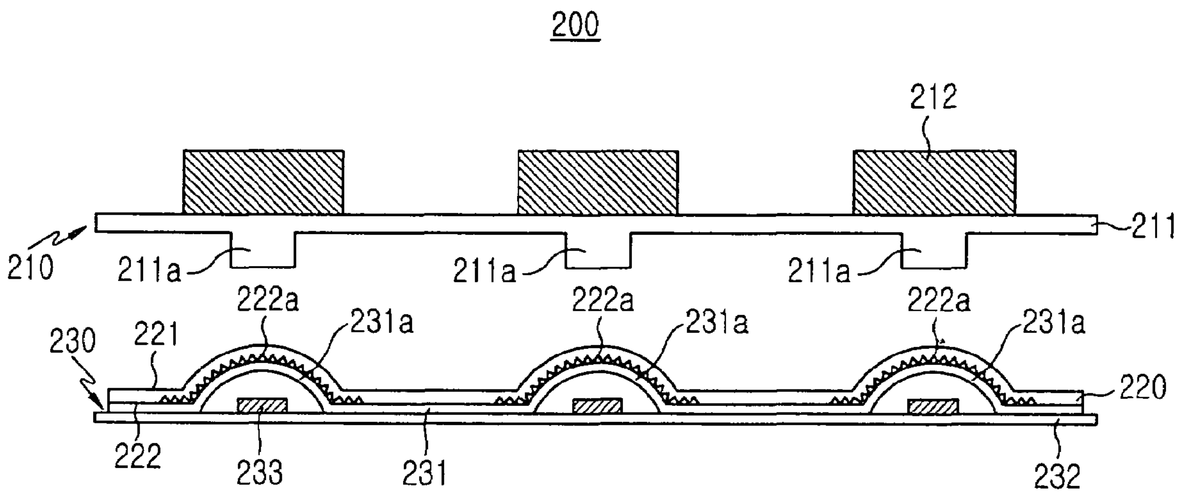
FIG. 2 is a sectional view of a keypad assembly for a portable terminal according to an exemplary embodiment of the present invention.
Figure 3:
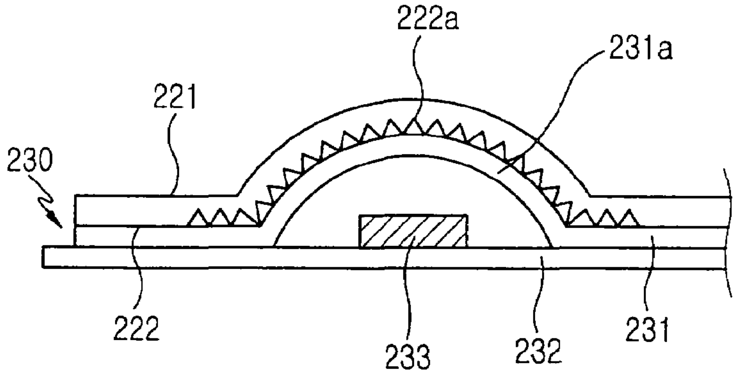
FIG. 3 is an enlarged sectional view of a waveguide of the keypad assembly for the portable terminal according to an exemplary embodiment of the present invention shown in FIG. 2.
Figure 4:
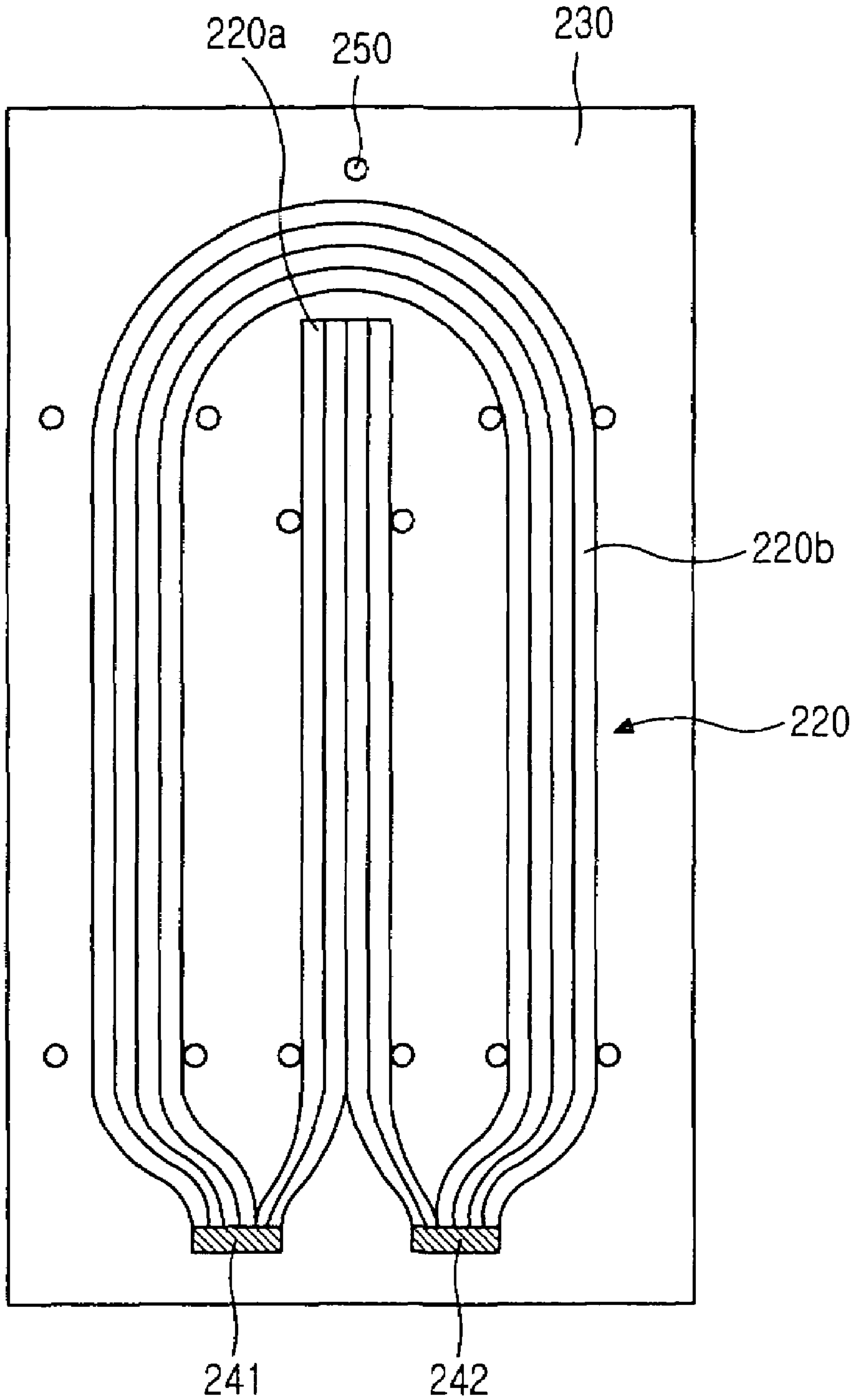
FIG. 4 is a plan view of the waveguide of the keypad assembly for the portable terminal according to an exemplary embodiment of the present invention, in which the waveguide is arranged on the switch substrate shown in FIG. 2.

FIG. 2 is a sectional view of a keypad assembly 200 according to an exemplary embodiment of the present invention. FIG. 3 is an enlarged sectional view of a part of the keypad assembly 200 shown in FIG. 2. FIG. 4 is a top view of an exemplary waveguide 220 arranged on a switch substrate 230 of the keypad assembly 200 shown in FIG. 2.

Referring to FIGS. 2 to 4, the keypad assembly 200 according to an exemplary embodiment of the present invention includes a keypad 210, the waveguide 220, the switch substrate 230 placed below a second surface 222 of the waveguide 220 to have at least one switch 231*a* and 233, and at least one light source 241 and 242.

The keypad 210 includes an elastic layer 211 and at least one key button 212 formed on the elastic layer 211.

The elastic layer 211 according to an exemplary embodiment of the present invention has a plate shape, which has at least one key button 212 and pressing protrusions 211*a* formed on both surfaces thereof to be vertically aligned. The key buttons 212 may be formed on an upper surface of the elastic layer 211. The pressing protrusions 211*a* may be formed on a lower surface of the elastic layer 211 to face a first surface 221 of the waveguide 220. The elastic layer 210 is made of material having excellent elasticity, such as synthetic resin and silicone. Consequently, the key button 212 returns to an initial state after a user activates the key button 212.

Characters, numbers, etc. may be printed on an upper surface of each of the key buttons 212. The key buttons 212 are made of the same material as or a different material from the elastic layer and integrated with the elastic layer 211. Meanwhile, the key buttons 212 may be made of material such as polycarbonate and acryl based resin, which in turn is attached to the elastic layer 211. The key buttons 212 can have any shape including shapes of a circle, oval, square and the like, if necessary. Separate elastic layers/films can be inserted between the key buttons 212 and the elastic layer 211, and polyurethane film can be used for the separate films.

The plurality of the pressing protrusions 211*a* according to an exemplary embodiment of the present invention may be formed on a lower surface opposite to the upper surface of the elastic layer 211 on which the key buttons are formed. The pressing protrusions 211*a* are integrally formed with the elastic layer 211. Alternatively, they may be separately formed before being attached to the elastic layer 211 by adhesive.

The waveguide 220 may have the first surface 221 facing the lower surface of the elastic layer 211 and the second surface 222. The second surface 222 may include reflection patterns 222*a*, to reflect light toward the above direction, corresponding key button 212, at portions corresponding to the key buttons 212 respectively. Further, a side of the waveguide 220 may be coupled to or may include light sources 241 and 242 and tend to transmit and guide light from the light source 241 and 242 within the waveguide 220, except at the intended exposure points (e.g., at the key buttons 212). The waveguide 220 may include the light guide plate or optical fiber array. The light guide plate may be made of any optically transparent material using any of the well-known materials and techniques known to those skilled in the art. The exemplary examples of these materials are—silicone, polycarbonate or acryl based resin. The exemplary examples of the well-known molding techniques are injection or press molding process. The optical fiber array may be manufactured by arranging a plurality of optical fibers.

The light guide plate may have a convex shape at points where the switches 233 are disposed, as shown in FIG. 2. Alternatively, the light guide plate can be flat or substantially flat without having noticeably convex points or any other shape, as long as it serves its role as the light guide.

The reflection patterns 222*a* may be formed at portions on the second surface 222 of the waveguide 220 to face each pressing protrusion 211*a* according to an exemplary embodiment of the present invention. The reflection patterns 222*a* may diffusively reflect a part of the light transmitting in the waveguide 220. This results in illuminating the key buttons 212.

The reflection pattern 222*a* may be formed by a method of scratching or printing them on the second surface 222 of the waveguide 220. The density of the reflection pattern 222*a* may be set differently at different locations to uniformly illuminate the key buttons 212.

Light sources 241 and 242 according to an exemplary embodiment of the present invention may be attached to a side of the switch substrate 230. The light sources 241 and 242 are mounted on the switch substrate 230 so that light emitting surfaces of the light sources 241 and 242 are opposite to the side of the waveguide 220. The light emitted from the light sources 241 and 242 is transmitted through the side of the waveguide 220 in the waveguide 220. Light emitting diodes can be generally used as the light sources 241 and 242.

The exemplary waveguide 220 shown in FIG. 4 includes a first optical fiber array 220*a* straightly arranged at a center portion of the waveguide 220 and a second optical fiber array 220*b* surrounding the first optical fiber array 220*a*. The first optical fiber array 220*a* is divided at an end thereof into two parts. The two parts of the first optical fiber array 220*a* are connected to the light sources 241 and 242, respectively. The second optical fiber array 220*b* has both ends connected to the light sources 241 and 242, respectively.

The switch substrate 230 may have a plurality of supporting protrusions 250 formed on the upper surface thereof so as to guide the waveguide 220 to safely occupy a seat on an upper surface of switch substrate 230. The supporting protrusion 250 can be removed after assembling an optical fiber array on the switch substrate 230. By using the supporting protrusions 250, the waveguide 220 may be positioned right on the substrate 230 or may be suspended over the substrate 230. The switch substrate 230 may include a printed circuit board 232 and a dome sheet 231.

The printed circuit board 232 according to an exemplary embodiment of the present invention has a plurality of conductive contact members 233 formed on an upper surface thereof. A contact member 233 and corresponding dome 231*a* may construct each of switches 233 and 231*a*. Further, each switch 233 and 231*a* is vertically aligned with the corresponding pressing protrusion 211*a*. The printed circuit board 232 may include a flexible printed circuit board.

The dome sheet 231 is disposed on the upper surface of the printed circuit board 232, which includes a plurality of conductive domes 231*a* having a hemispheric shape. The respective domes 231*a* fully cover the corresponding contact member 233.

When a user pushes any key 212, the corresponding pressing protrusion 211*a* of the elastic layer 211 positioned below the key 212 presses the waveguide 220 and the corresponding dome 231*a*. The pressed dome 231*a* forms an electric contact, along with the corresponding contact member 233.

Figure 5:
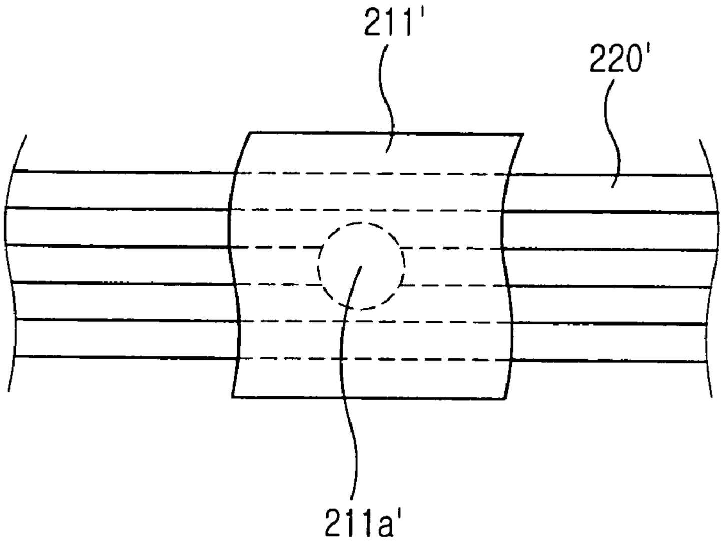
FIGS. 5 and 6 are views illustrating the waveguide of the keypad assembly for the portable terminal according to an exemplary embodiment of the present invention, in which the waveguide is disposed below a keypad shown in FIG. 2.
Figure 6:
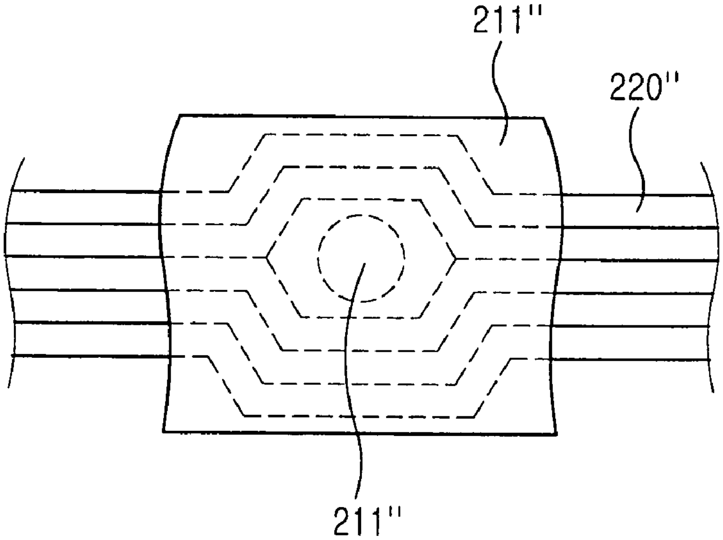

FIGS. 5 and 6 are views illustrating an exemplary waveguide disposed below keypads shown in FIG. 2. FIG. 5 is a view showing a waveguide 220', according to an exemplary embodiment of the present invention, disposed below a keypad 211', in which the waveguide 220' is arranged under the corresponding pressing protrusion 211*a*'. FIG. 6 is a view showing a waveguide 220" disposed below a keypad 211", in which the waveguide 220" is arranged around a corresponding pressing protrusion 211*a*" under the keypad 211".

Figure 7:
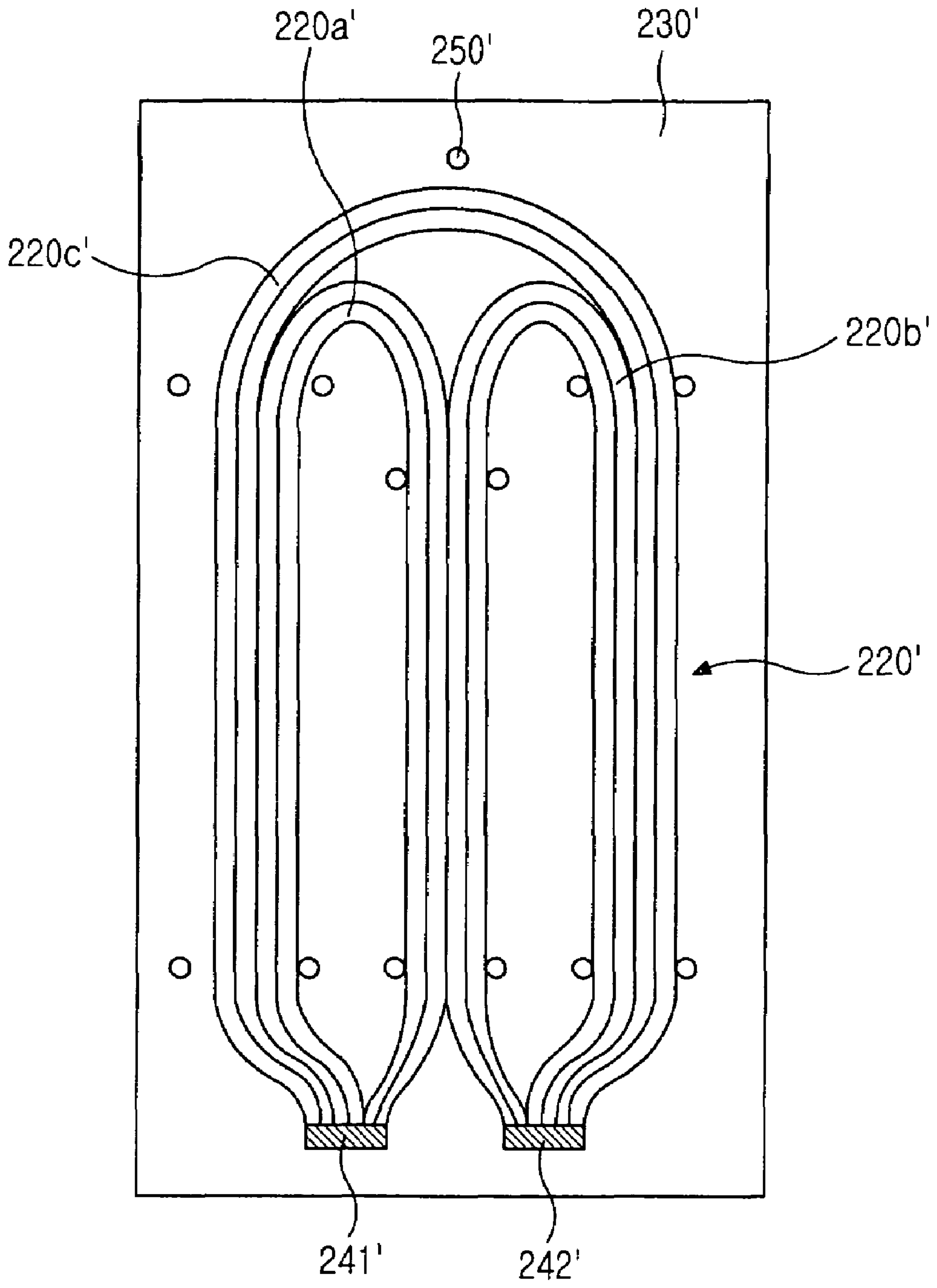
FIGS. 7 to 9 are views illustrating the waveguide of the keypad assembly for the portable terminal according to an exemplary embodiment of the present invention, in which the waveguide is arranged on the switch substrate shown in FIG. 2.
Figure 8:
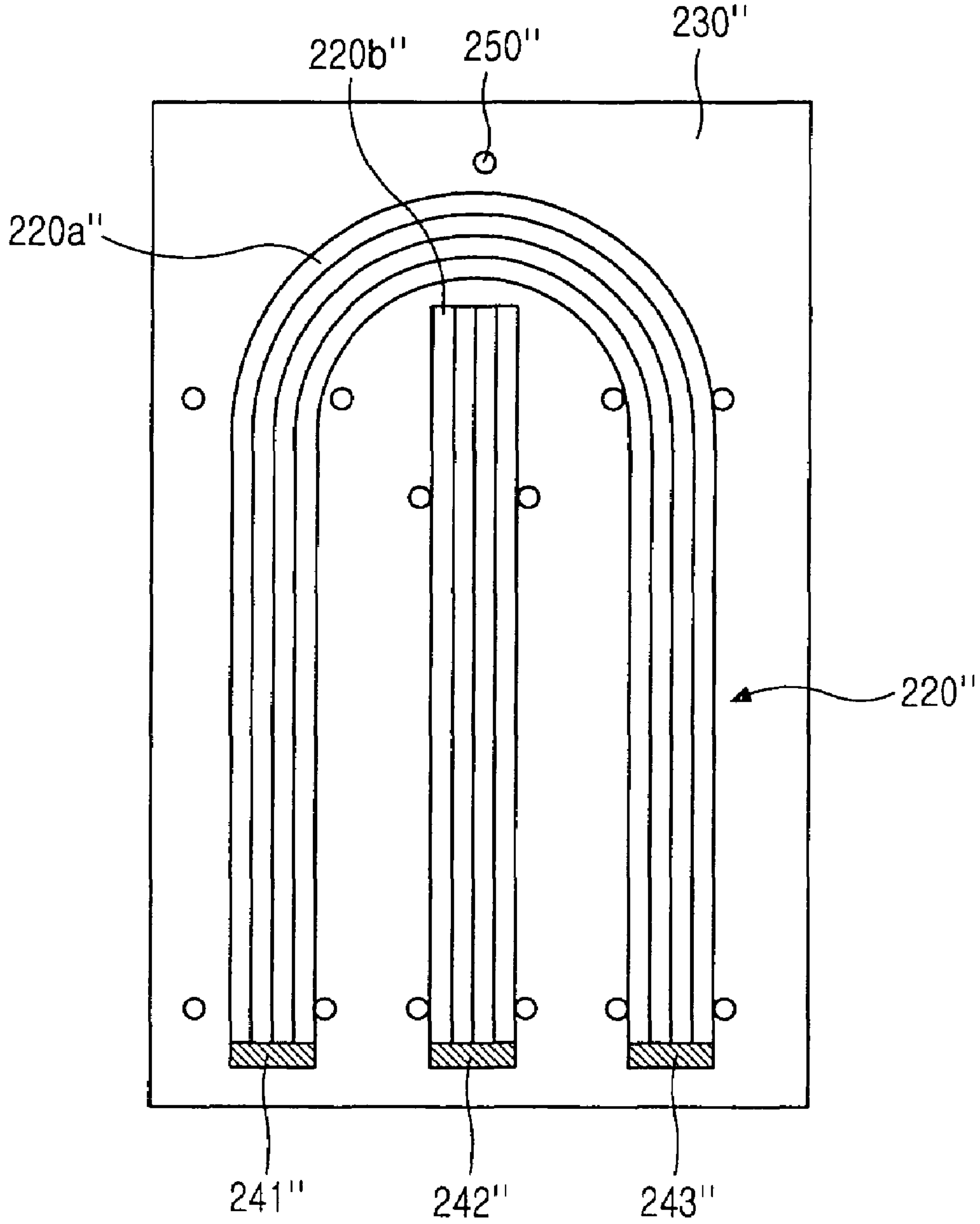
Figure 9:
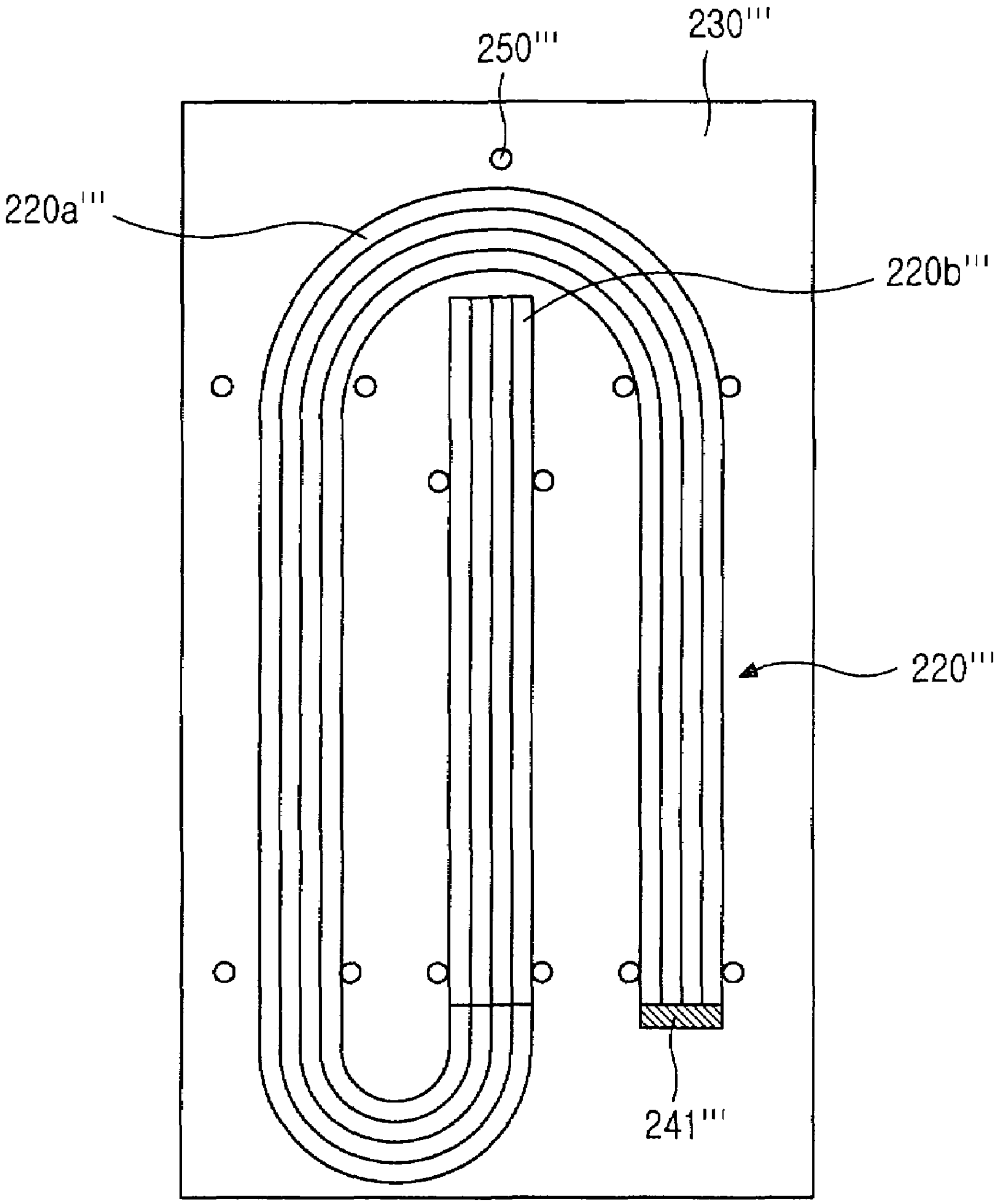

FIGS. 7, 8 and 9 are views illustrating an exemplary waveguide disposed on a switch substrate shown in FIG. 2. FIG. 7 is a view showing a waveguide 220' arranged on a switch substrate 230' and including first, second and third optical fiber arrays 220*a*', 220*b*' and 220*b*'. A plurality of supporting protrusions 250' protrudes on the switch substrate 230'.

The first optical fiber array 220*a*' has both ends connected with a light source 241' to form a closed-loop. The second optical fiber array 220*b*' also has both ends connected with a light source 242' to form a closed-loop. Further, the third optical fiber array 220*c*' has both ends respectively connected with each of the light sources 241' and 242' to enclose the first and second optical fiber arrays 220*a*' and 220*b*'.

FIG. 8 is a view showing a waveguide 220" which includes first and second optical fiber arrays 220*a*" and 220*b*" on a switch substrate 230". A plurality of supporting protrusions 250" protrudes on the switch substrate 230" in order to support the waveguide 220".

The first optical fiber array 220*a*" has a horseshoe shape according to an exemplary embodiment of the present invention. It is arranged on the switch substrate 230" to surround the second optical fiber array 220*b*" arranged at a center portion of the switch substrate 230". Both ends of the first optical fiber array 220*a*" are coupled to the light source 241" and 243". Only one end of the second optical fiber array 220*b*" is connected to the light source 242".

FIG. 9 is a view showing an exemplary waveguide 220"' including first and second optical fiber arrays 220*a*"' and 220*b*"' and arranged on the switch substrate 230"' according to an exemplary embodiment of the present invention. A plurality of protrusions 250"' are formed on the switch substrate 230"' in order to support the waveguide 220"'.

The first optical fiber array 220*a*"' has a horseshoe shape, according to an exemplary embodiment of the present invention. One end of the first optical fiber array 220*a* is coupled to a light source 241"' and the other end of which extends to one end of the second optical fiber array 220"'. That is, the light emitted from the light source is transmitted through the first optical fiber array 220*a*"' to the second optical fiber array 220*b*"'.

The present invention can reduce the light loss by transmitting the light through the waveguide to each key button while irradiating the transmitted light through the keys out of the terminal. In the present invention, the light emitting diode is placed at one end of the waveguide, thereby reducing the number of light emitting diode required for constructing the keypad.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A keypad assembly comprising:

a keypad having at least one elastic layer and at least one key button on the elastic layer;

wherein the elastic layer further includes at least one pressing protrusion;

a waveguide separate and apart from the keypad for transmitting and guiding light therethrough, the waveguide being placed below the elastic layer and having at least one reflection pattern arranged below the at least one pressing protrusion and facing the pressing protrusion to reflect light to exit the waveguide toward a respective key button; and a switch substrate arranged under the waveguide and having at least one switch formed on an upper surface said switch substrate, which faces the protrusion, wherein as the key button is pressed, a portion of the waveguide being deformed towards the switch substrate for directly contacting the switch on the switch substrate for activating the switch by contact with the waveguide.

2. The keypad assembly as claimed in claim 1, wherein the switch substrate comprises a printed circuit board dome sheet.

3. The keypad assembly as claimed in claim 1, wherein the waveguide includes at least one optical fiber array.

4. The keypad assembly as claimed in claim 1, further comprising at least one light source mounted on the upper surface of the printed circuit board with its light emitting surface facing the lateral surface of the waveguide.

5. The keypad assembly as claimed in claim 2, further comprising at least one light source mounted on the upper surface of the printed circuit board with its light emitting surface facing the lateral surface of the waveguide.

6. The keypad assembly as claimed in claim 5, wherein the light source includes a light emitting device.

7. The keypad assembly as claimed in claim 1, wherein the waveguide includes at least one light guide plate.

8. The keypad assembly as claimed in claim 7, wherein the at least one light guide plate is made of silicone, polycarbonate resin or acryl based resin.

9. The keypad assembly as claimed in claim 1, wherein the reflection pattern is formed on a lower surface of the waveguide; and wherein the reflection pattern comprises different densities for diffusively reflecting a pan of the light transmitted in the waveguide.

10. The keypad assembly as claimed in claim 7, wherein the at least one light guide plate is flat.

11. The keypad assembly as claimed in claim 1, wherein a density of the at least one reflection pattern is set differently at different locations of the at least one reflection pattern to uniformly illuminate the plurality of key buttons.

12. The keypad assembly as claimed in claim 2, wherein the printed circuit board is flexible.

13. The keypad assembly as claimed in claim 1, wherein the switch comprises a conductive contact member and a conductive dome covering the contact member.

14. The keypad assembly as claimed in claim 1, wherein the reflective pattern is adapted to cause a diffuse reflection.

* * * * *